United States Patent [19]
Néry

[11] 3,956,697
[45] May 11, 1976

[54] VOLTAGE DETECTOR FOR DETECTING DIFFERENT VOLTAGE LEVELS IN CONDUCTORS OF AN ELECTRICAL POWER LINE

[75] Inventor: Maurice Néry, Paris, France

[73] Assignee: IPA Internationale Patent - und Lizenz-Anstalt, Liechtenstein

[22] Filed: Jan. 24, 1974

[21] Appl. No.: 436,278

Related U.S. Application Data
[63] Continuation of Ser. No. 351,067, April 13, 1973, abandoned.

[30] Foreign Application Priority Data
Apr. 17, 1972  France .............................. 72.213393

[52] U.S. Cl. ............................. 324/133; 340/248 D
[51] Int. Cl.² ......................................... G01R 19/16
[58] Field of Search ............. 324/51, 72.5, 133, 52, 324/72; 340/248 A, 248 B, 248 C, 248 D

[56] References Cited
UNITED STATES PATENTS

| | | | |
|---|---|---|---|
| 3,009,099 | 11/1961 | Muller | 324/52 |
| 3,021,514 | 2/1962 | Regis et al. | 324/133 X |
| 3,072,895 | 1/1963 | Kaufman | 324/133 X |
| 3,229,274 | 1/1966 | Riley et al. | 340/248 CX |
| 3,452,346 | 6/1969 | Kupersmit | 324/72 X |
| 3,543,154 | 11/1970 | Gordon | 324/133 X |
| 3,544,983 | 12/1970 | Wallace et al. | 340/248 A |
| 3,617,879 | 11/1971 | Mugnier | 324/133 X |
| 3,619,775 | 11/1971 | Naylor et al. | 324/133 X |
| 3,624,503 | 11/1971 | Barrowcliff | 324/133 |
| 3,742,351 | 6/1973 | Palmer et al. | 324/72.5 |
| 3,805,155 | 4/1974 | Tsuda et al. | 324/133 |

Primary Examiner—Gerard R. Strecker
Attorney, Agent, or Firm—Ladas, Parry, Von Gehr, Goldsmith & Deschamps

[57] ABSTRACT

A voltage detector has a plurality of voltage detection circuits which, at their respective inputs, are electrically connected in common to a feeler serving as a test probe for contacting a power line conductor. The detection circuits are cascaded in the order of successively increasing individual voltage detection thresholds thereof at and above which they respectively produce output signals in response to the feeler voltage, the arrangement being such that each circuit other than the circuit of lowest threshold is enabled to produce its output signal only upon an output signal being produced by the circuit immediately preceding it. The circuit outputs are connected to respective inputs of a warning signal generator which produces an output warning signal uniquely characteristic of the number of detection circuit output signals it receives and thus uniquely characteristic of the voltage condition of the power line conductor contacted by the probe.

11 Claims, 4 Drawing Figures

VOLTAGE DETECTOR FOR DETECTING DIFFERENT VOLTAGE LEVELS IN CONDUCTORS OF AN ELECTRICAL POWER LINE

This is a continuation of application Ser. No. 351,067, filed Apr. 13, 1973, now abandoned.

BACKGROUND OF THE INVENTION

This invention relates to a voltage detector for detecting different voltage levels in conductors of an electrical power line and generating corresponding acoustic or optical warning signals.

Prior art electric voltage detectors usually are provided with a contact element or feeder destined either to be placed in contact with, or to the brought in proximity of a conductor which might be alive. Such apparatus comprises its own source of voltage which is connected to a warning device by the intermediary of a detecting circuit provided with semiconductors which are capable of letting pass or interrupting the current of said source when a feeler is subjected to a potential which at least is equal to a predetermined value constituting the threshold sensitivity. When this threshold is attained the detection circuit is converted to conductive condition and lets pass the current of said source to the warning device which then emits a signal, for example an acoustic signal, indicating the presence of a voltage. Such detectors usually comprise an auxiliary circuit permitting to apply at the input of the detector circuit a voltage equivalent to that which reaches it in the actual conditions of use and which allows to check its good condition of operation.

The state of the art is illustrated in the German Pat. Nos. 1,134,157 and 1,054,169, the Austrian Pat. No. 288,544, the Swiss Pat. No. 492,222.

Such apparatus is principally used for ascertaining whether the conductors of a line or of an installation are insulated with respect to their source of energy and whether it is thus possible to ground and short-circuit them, and then to effect work on them. Nevertheless, even in this case, these conductors have a residual voltage induced by other adjacent conductors which remained connected to the power line. When this voltage, though being relatively weak, still exceeds the threshold of sensitivity of the detector, this latter emits a signal of presence of voltage and it becomes impossible to discriminate these conductors under induced voltage from those fed by direct voltage. However, it is advisable that the operator becomes aware of the presence of an induced voltage.

The object of the present invention is the provision of a detector which is capable of emitting signals, preferably acoustic signals, of at least two different kinds of which can be easily distinguished and which are released respectively from at least two thresholds of different voltages applied to the feeler. If these thresholds are conveniently spaced with respect to the voltage of the power line, such a detector will emit a certain signal in presence of a conductor under direct voltage, and a different signal in presence of a conductor only under an induced residual voltage.

If such a detector comprises more than two thresholds of different voltage conveniently spaced and a corresponding number of kinds of signals will be emitted, it could be used in a great number of installations having voltages of different magnitudes and would allow, for all of them to obtain a different signal according to the installation being energized by direct voltage or by an induced residual voltage.

In practice, the signal emitted by most of the known detectors is not absolutely invariable and can be influenced in a certain degree by the potential which is applied to the feeler. For example, it is the case of a luminous signal which becomes more brilliant when this potential increases, or still the case of a musical note which varies more or less (in intensity, in frequency, etc.) according to the potential, but it is impossible to interpret these variations in order to evaluate at least approximately the magnitude of the potential applied to the feeler.

The primary object of the invention accordingly is a voltage detector capable of emitting signals of different form which can be easily recognized, corresponding each to a determined threshold potential. For example, when the three thresholds of increasing potentials are designated by P1, P2 and P3, the warning device will emit, from the threshold P1, a sequence of long and spaced acoustic signals. When the potential will attain the value P2 the signals will become short and approached. Finally, at a potential at least equal to P3, the apparatus will emit a uniform uninterrupted sound.

It will be understood that the warning device can emit optical signals, or there can be adopted continuous acoustic signals, but of different tonality, a variety of signals being easily available to the expert.

SUMMARY OF THE INVENTION

The invention proposes to provide a voltage detector which is provided with a control system for the warning device comprising at least two distinct detection circuits which are connected to a feeler and responsive to thresholds of different potentials. The control system is organised in such manner that, if for example the first circuit which is sensitive to a potential P1, is conductive, while the second circuit which is sensitive to a potential P2 is blocked, the warning device delivers a series of long and spaced signals. If, on the contrary, the two circuits become conductive, it delivers a series of short and approached signals which indicate without ambiguity that there is present a potential which is at least equal to P2.

Considering that the induced residual voltages rarely exceed 10% of the direct voltage, there can be realised a detector according to the invention the potential thresholds of which are adjusted for example to 1000, 8000 and 60,000 V (making allowance for a sufficient margin of security) and which would be usable, in principle, within a limit of about 450,000 volts.

However, it cannot be disregarded that a preference exists in favour of detectors having a very low no load consumption, which constantly remains in warning condition. It could then happen that the first detector circuit which is supposed to be set to a threshold of 1000 volts, produces the release of the presence of voltage signal under the influence of the field of the potential of a very high voltage line situated at a relatively great distance. In order to avoid this inconvenience, the invention also concerns an automatic contact breaker which only establishes the connection between the source and the detector circuits only when the feeler makes contact with the conductor of which the condition of voltage is to be checked. This contact breaker can be mechanically actuated by the pressure of the feeler against the conductor, but preferably it is constituted by a particular detection circuit which has the propriety of getting released only when the feeler makes contact with a live conductor. Also, according to the invention, this contact breaker comprises a delay action destined to disconnect the current when the warning member has not emitted any signal at the end of a determined period of time. It thus reduces the consumption of the apparatus to a minimum, since when at rest, the detector circuits are separated from their source of voltage and also when they are in use, they will be separated again when a potential which is at least equal to P1 has not been detected.

Another problem as a result of the conception of the detector according to the invention arises by the control of the correct state of functioning of all circuits concurrent to the detection. It is possible to provide a commutator successively applying, at the input to each circuit, a voltage equivalent to that which is supplied to it at the actual conditions of use, but this solution is relatively complicated and requires particular attention of the user in order to ensure that the different forms of signals corresponding to the different thresholds of potentials are well emitted in turns. In order to solve this difficulty the invention also provides that each detector circuit controls the passage of current towards the following detector circuit, in the order of increasing thresholds. Owing to this disposition it is possible to apply the control voltage simultaneously at the input of all circuits and it suffices to ascertain that the warning device emits the signal corresponding to the last circuit, because this latter cannot change into conductive condition unless the preceding circuit or circuits are themselves in this condition. Accessorily, this disposition can also contribute to reduce the consumption of current of the device.

Finally, in view of ensuring the most complete safety of use, provision is made that when the warning device is put into action by the application of a potential to the feeler, the signal cannot be interrupted except by an intervention of the operator. For doing this, this latter must draw the device back towards him, so that, even in very noisy surroundings, he cannot miss to perceive the signal. For this purpose the invention provides that each detector circuit comprises a bistable relay destined to maintain it in conductive condition into which it may have been brought during the detection operation and which then can be removed only by the action of a switch.

A detector which is conforming to the invention accordingly offers the following advantages:
  it permits to recognize the presence of potentials of different magnitudes on electric conductors, by emitting different and easily discernable signals, so as to be able, particularly, to distinguish direct and induced voltages in a given installation,
  its consumption at no load is unimportant which fact renders superfluous the presence of a manual interrupted "stop-start" and allows the detector to constantly remain in operating condition,
  it is not sensitive to potential fields, its operation releases only upon contact of a live conductor, accordingly during its approaching path until the point of contact, it remains indifferent to the influence of adjacent conductors,
  a simple single pole switch suffices to control the operation of all circuits the response to which is given by the characteristic signal of the highest potential threshold,
  the signal which is released by the presence of a potential on a conductor put into contact with the feeler is maintained after discontinuance of this contact and can only be interrupted by a voluntary action.

BRIEF DESCRIPTION OF DRAWINGS

The particular details and features of the invention will appear more clearly in the description which will follow and in the annexed drawings in which.

In these diagrams the double line connections represent the energy supply lines of the circuits.

Figure 1:
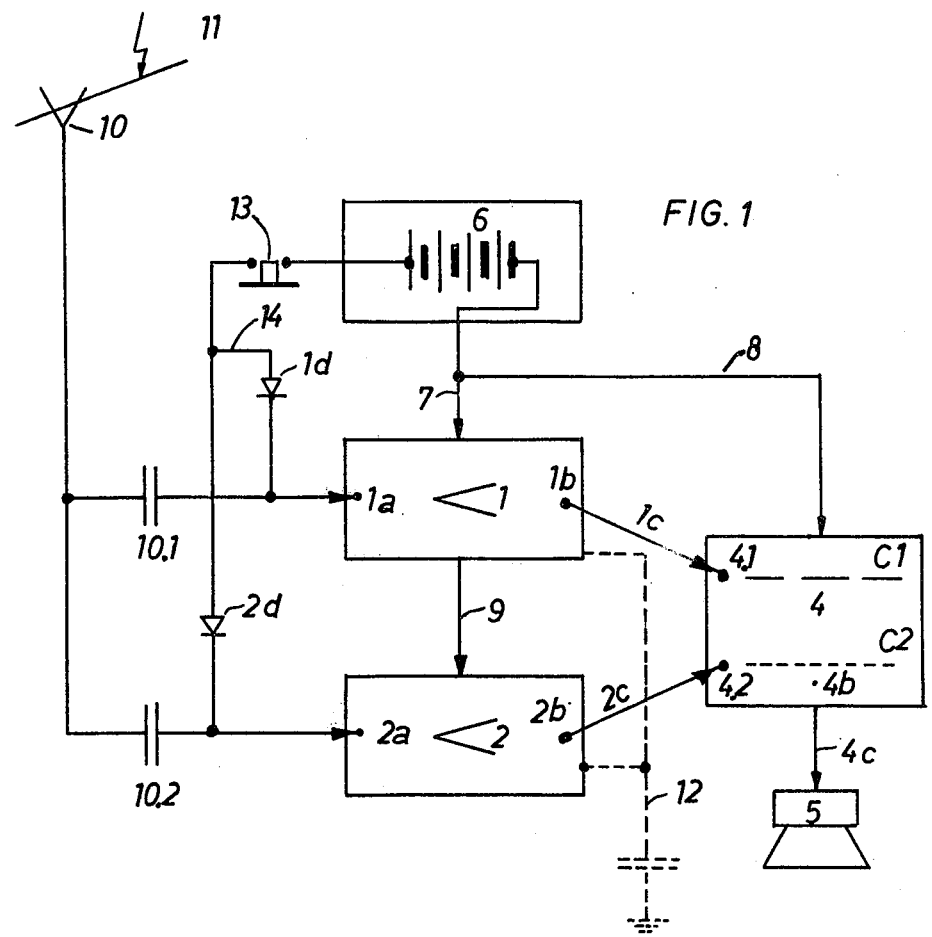
FIG. 1 represents the operational diagram of a simplified form of embodiment having two detector circuits corresponding to two different potential thresholds.
Figure 2:
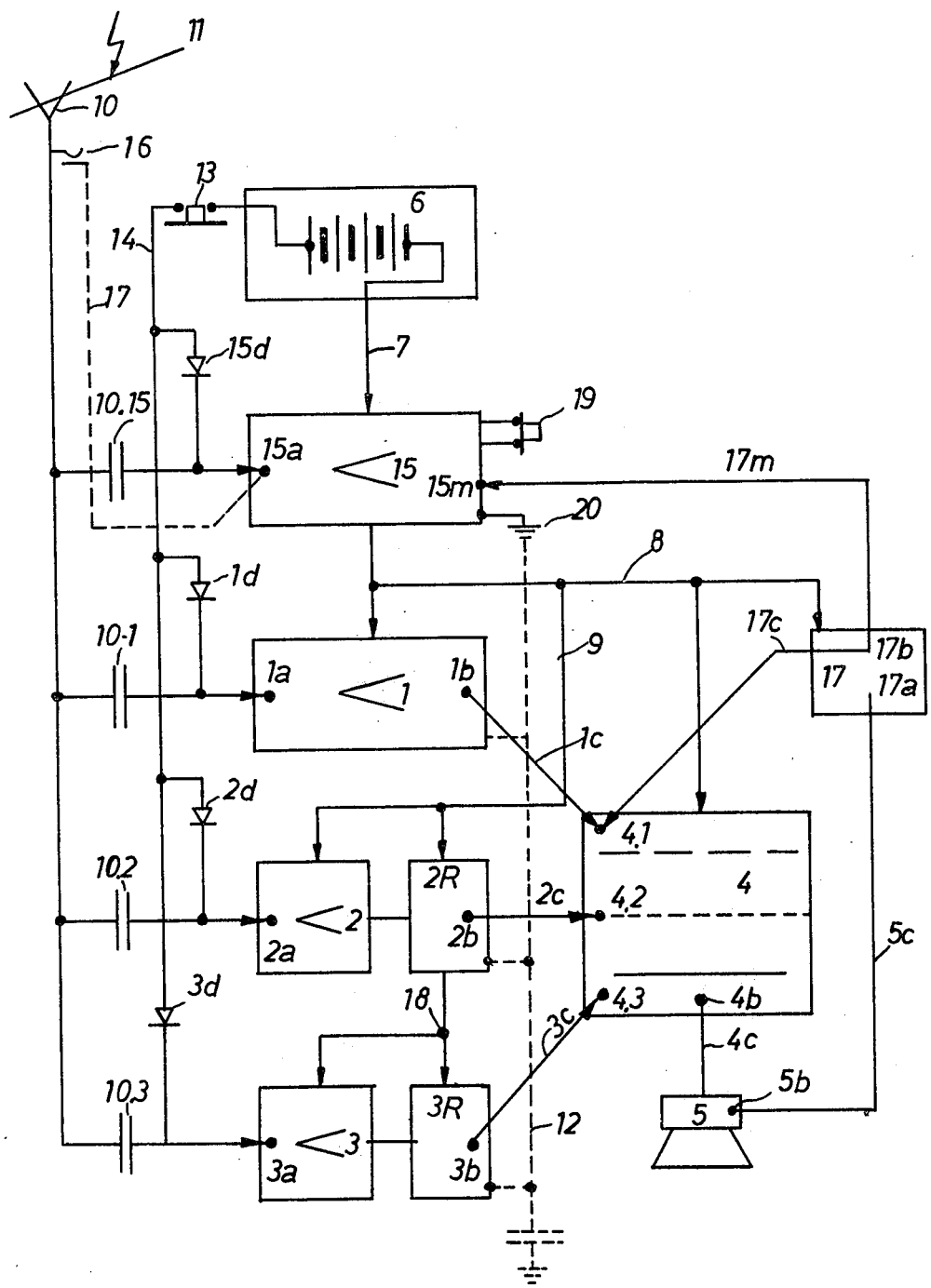
FIG. 2 represents the operational diagram of a complete form of embodiment comprising an interruptor circuit and three detector circuits corresponding to three different potential thresholds.

In the basic operational Diagrams of FIGS. 1 and 2 the detector circuits are shown by boxes marked <1, <2, and <3. The actual devices and connections and the arrangement thereof in these boxes are shown in FIG. 3 and hereinafter described in detail with reference to said FIG. 3.

Figure 3:
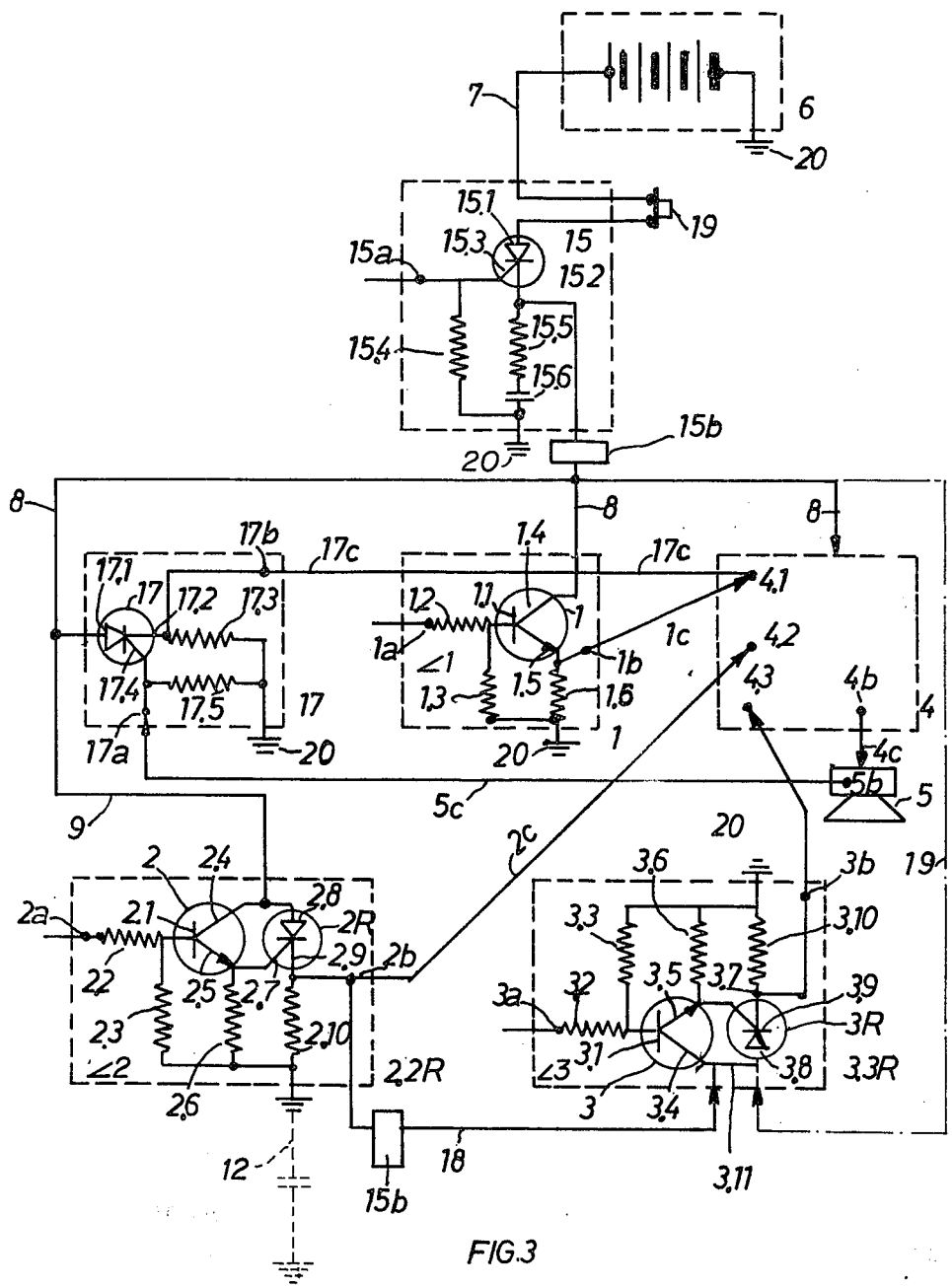
FIG. 3 represents by a simplified form the diagram of the principle circuits of FIG. 2 and of their mutual connections.

The circuit 4 in FIGS. 1, 2 and 3 is shown by a box marked 4. The actual devices and connections and the arrangement thereof in this box are hereinafter described in detail with reference to said FIG. 4.

DETAILED DESCRIPTIONS OF THE PREFERRED EMBODIMENTS

According to the basic operational diagram of FIG. 1 which represents a simplified form of embodiment, the detector comprises a first detector circuit 1 the sensitivity threshold of which is adjusted to a value P1 and which comprises an input 1a and an output 1b, a second detector circuit 2 the threshold of sensitivity of which is adjusted to a value P2 and which comprises an input 2a and an output 2b, a circuit 4 capable of producing recurrent signals of two kinds, the first ones having a slow cadence designated by C1 and the second ones having a rapid cadence designated by C2 when a voltage is applied to two inputs 4.1 and 4.2, respectively. These electrical signals are transmitted through an output 4b and a conductor 4c to a warning device 5 capable of converting the electrical signals into acoustic signals. The inputs 4.1 and 4.2 are connected to the outputs 1b and 2b, respectively, of the circuits 1 and 2 by the connections 1c and 2c, respectively. The circuits 1 and 4 are supplied with energy from a current source 6 such as a battery, by means of conductors 7, 8. The circuit 2 is supplied by means of the conductor 9 through the circuit 1, so that the energy of the source 6 arrives at the circuit 2 only when the circuit 1 is conductive.

The detector is provided with a feeler 10 capable of being brought into contact with a conductor 11 of which the condition of voltage is desired to be known. A fraction of the voltage picked up by the feeler 10 is transmitted to the inputs 1a, 2a of the detector circuits 1 and 2 across the connections 10.1, 10.2 which are for example capacitors. The part in dashed lines 12 shows the capacitive connection through space which will be closed between the mass 20 of the apparatus and the ground. The term "mass" is used to designate the system of conducting parts, including particularly the current supply source and a conducting housing containing the circuits and connected to one terminal of the source. These conducting parts may provide a capacity of about 10 - 11 - Farad with respect to the ground. In the presence of a high voltage these parts function as an output electrode for the very weak current above referred to. The source 6, on the other hand, is connected to an operation control switch 13 which is open at rest and allows, by the intermediary of a conductor 14 to apply voltages to the inputs $1a$, $2a$ of the circuits 1 and 2, which voltages are substantially equal to those which they can receive from the feeler 1 when this latter is subjected to potentials of respective values P1 and P2. Diodes $1d$ and $2d$ are inserted between the conductor 14 and the inputs $1a$ and $2a$ in order to avoid undesirable interactions between the circuits 1 and 2.

When the feeler 10 is brought into contact with the conductor 11 having a potential $P' \geq P1 < P2$, the detector circuit 1 becomes conductive and a voltage appears at the output $1b$ from where it arrives, by the connection $1c$ at the terminal 4.1 of the circuit 4 which consequently emits slow cadence signals C1 which are transmitted through the output $4b$ and the connection $4c$, to the warning member 5 which transforms then into acoustic signals. At the same time, for the reason of the conductive condition of the circuit 1, the circuit 2 is supplied by the source 6, but there does not result any perceptible effect since the potential of the conductor 11 is inferior to the threshold P2.

When, to the contrary, the conductor 11 has a potential $P'' \geq P2$ the same procedure as described above develops, but immediately after circuit 2 becomes in turn conductive, a voltage appears at the terminal $2b$ from where it arrives, by the connection $2c$, at the terminal 4.2 of the circuit 4 which then emits the rapid cadence signals C2, which are characteristic of the threshold of potential P2. The response time of the circuits is such that in practice the signals having the cadence C2 are released as soon as the feeler 10 is put in contact with the conductor 11.

The same process is reproduced when the operator closes the switch 13 which is open at rest, and by this means applies voltages of suitable magnitudes to the inputs $1a$ and $2a$ in order to control the proper functioning of the circuits 1 and 2: the circuit 1 passes to conductive condition and connects the circuit 2 to the source 6, which in turn becomes conductive and releases through the circuit 4 and the warning member 5 the emission of acoustic signals of rapid cadence C2. Thus, the proof is obtained that the circuits 1, 2 and 4 are in operative condition, since the circuit 2 which releases the signals C2 can only become conductive when the circuit 1 is itself in this condition. If, on the contrary, the closing of the switch 13 would produce the appearance of slow cadence signals C1, one would be informed by this that the circuit 2 is faulty.

The more complex form of embodiment represented by the fundamental operative diagram FIG. 2 comprises the same elements as the preceding one, but completed according to the following description.

Between the source and the whole of the circuits of the apparatus there is inserted a relay or switching device 15, essentially constituted by a relay, preferably a thyristor which, at rest, is in blocked condition. This relay can be controlled across a connection 17 and the input $15a$ of a suitable device or relay 15 by a contactor 16 which is open at rest and which can be closed mechanically by the pressure of the feeler 10 on the conductor 11, thus independently of the voltage condition of the conductor 11.

However, in a preferred mode of execution the invention provides that this relay is controlled electrically by the transitory oscillation which originates upon the contacting of the feeler 10 with the conductor 11 supposed to be live. This oscillation is then transmitted by a connection, for example a capacitor 10.15 to the input $15a$ of the device 15 which in fact behaves like a detector circuit which is so adjusted as to pass to conductive condition for a threshold of potential $P0 < P1$. The maintenance of the conductive condition of the device 15 is ensured in any case during a short duration, for example one-half of a second, by a retarding circuit. This switching device 15 will be described with greater detail in the portion of the description relative to FIG. 3.

The apparatus also comprises a bistable relay 17 preferably capable of being controlled by a voltage taken from $5b$ at the warning member 5 when this latter is operative and transmitted by a connection $5c$ to an input $17a$ of the relay 17. When this latter becomes conductive, there appears a voltage at its output $17b$ and is applied through the connection $17c$ to the input terminal 4.1 of the circuit 4 which, as it has already been indicated, at these conditions emits slow cadence signals C1. On the other hand, the passage of the relay 17 to conductive condition has the effect to also maintain the switching device or relay 15 at conductive condition, which device otherwise will return to the blocked condition within the delay which is set by its retarding circuit. According to the type of relay adopted for the device 15, its maintenance at conductive condition may be obtained, by the current consumed by the relay 17 through the conductor 8, or by applying a voltage to an auxiliary input $15m$ of the device 15, which voltage is then taken up at the output $17b$ of the relay 17 and conducted to the input 15 by the conductor $17m$.

In the form of embodiment of FIG. 2 the detector circuit 2 is supplied directly from the device 15, by a conductor 9 derived from the conductor 8. This feed accordingly does not transit by the detector circuit 1 as in the form of embodiment described by FIG. 1. Besides, the detector circuit 2 is associated to a bistable relay 2R capable of holding the circuit in conductive condition after disappearance of the voltage at its input 2, which releases its passage to this condition.

Moreover, there is added a third detector circuit 3 associated to a bistable relay 3R which can be compared to the relay 2R. This circuit 3 for which the threshold of response is adjusted to a value P3, comprises an input $3a$ connected to the feeler, by example across a capacitive connection 10.3, and an output $3b$ connected by a line $3c$ to an input 4.3 of the circuit 4. When a voltage is applied to the input 4.3, then the circuit 4 can produce an uninterrupted signal designated by C3 which is transmitted by the warning device 5 as a uniform and continuous tonality. The circuit 3 is fed by energy across the circuit 2, by a conductor 18 to which the current is admitted only when the circuit 2 is in conductive condition.

The switching device 15 is connected to the source in series with a switch 19 which is closed at rest. The instantaneous opening of this switch 19 permits the relay or device 15 to be returned to blocked condition, as well as the other relays 2R, 3R and 17 which, by their construction return to this condition as soon as they are no longer supplied by the source. Finally, the control circuit 14 is connected to the inputs 15a and 3a by diodes 15d and 3d across of which the switch 13, open at rest, permits to apply voltages to said inputs which are substantially equal to those which can reach them from the feeler 1 when this latter is subjected to potentials of the values P0 and P3, respectively.

FIG. 3 represents in a simplified form the diagram of the principal circuits of FIG. 2 and their reciprocal connections, so as to better understand the manner in which the passage of each relay to conductive condition prepares the operation of the following relay. According to this diagram all these relays are thyristors.

The relay 15 has its anode connected to the positive pole of the current source 6 through the switch 19 which is closed at rest, and via the upstream feed conductor 7. Its cathode 15.2 is connected, on the one hand to the downstream feed conductor 8, on the other hand to the source 6 by the intermediary of the mass 20 of the detector by the intermediary of a retarding circuit formed by the resistor 15.5 and the capacitor 15.6 which are capable to ensure the passage of the necessary current for maintaining the thyristor at conductive condition during a short period from the instant when it has been excited, by the application of a voltage to its trigger 15.3 which is connected to the input 15a, on the one hand and to the mass on the other hand, by a stabilising resistor 15.4.

The detector circuit 1 is represented in simplified manner in the form of a transistor 1 the base electrode 1.1 of which is connected, on the one hand to the input across a resistor 1.2, on the other hand to the mass 20 across a polarisation resistor 1.3. The collector 1.4 is connected to the positive pole of the source through the thyristor 15 by the intermediary of the counter 8. The emitter 1.5 is connected, on the one hand to the mass via a resistor 1.6 and, on the other hand, to the output 1b.

The relay 17 has its anode 17.1 connected to the positive pole of the source through the conductor 8 and the thyristor 15, its cathode 17.2, at the one hand to the mass 20 via a holding resistor 17.3, on the other hand to the output 17b. The trigger 17.4 is connected, on the one hand to the input 17a on the other hand to the mass 20 via a stabilizing resistor 17.5.

The detector circuit 2 is represented in simplified manner by a transistor 2 the base electrode 2.1 of which is connected, on the one hand to the input 2a via a resistor 2.2, on the other hand to the mass 20 via a polarizing resistor 2.3. The collector 2.4 is connected to the positive pole of the source across the thyristor 15 by the intermediary of the conductors 8 and 9. The emitter 2.5 is connected, on the one hand to the mass 20 via a resistor 2.6, on the other hand to the trigger 2.7 of the thyristor 2R the anode 2.8 of which is connected to the positive pole of the source 6 in parallel with the collector 2.4, and the cathode 2.9 which is connected, on the one hand to the mass 20 via a holding resistor 2.10, on the other hand to the output 2b and to the downstream feeding conductor 18.

The detector circuit 3 is represented in simplified manner by a transistor 3 the base electrode 3.1 of which is connected, on the one hand to the input 3a via a resistor 3.2, on the other hand to the mass 20 via a polarizing resistor 3.3. The collector 3.4 is connected to the + of the source via the conductor 18, the thyristor 2R, the conductors 9 and 8 and the thyristor 15. The emitter 3.5 is connected, on the one hand to the mass 20 via a resistor 3.6, on the other hand to the trigger 3.7 of the thyristor 3R the anode 3.8 of which is connected to the positive pole of the source in parallel with the collector 3.4 by a connection 3.11. In a modification it is provided that the anode 3.8 could be directly connected to the thyristor 15 by the intermediary of a conductor 19 shown by dash-and-dot lines and of the conductor 8 while suppressing in this case the connection 3.11. The cathode 3.9 is connected, on the one hand to the mass 20 via a holding resistor 3.10, on the other hand to the output 3b.

Figure 4:
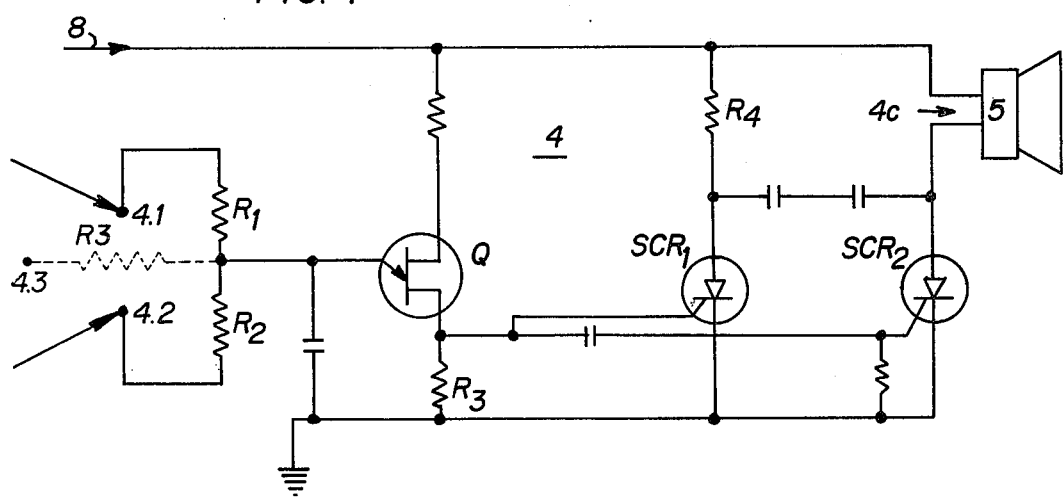
FIG. 4 represents the devices and connections and the arrangement thereof in circuit 4 of FIGS. 1, 2 and 3.

The circuit 4 shown in FIG. 4 shows the two input terminals 4.1 and 4.2 from the detector circuits 1 and 2 respectively. A third input terminal 4.3 and resistor $R_3$ is only necessary to accommodate the third detector 3 of three stage embodiments such as those of FIG. 2 or 3, and will not exist in the embodiment of FIG. 1. The corresponding leads are dotted in FIG. 4. Signals from these input terminals pass through resistors $R_1$ and $R_2$ to a unijunction transistor Q which operates as a relaxation oscillator to deliver a train of trigger pulses to the semi-conductor gates $SCR_1$ and $SCR_2$. The conductor 8 supplies current from sources 6 through the warning device 5 to said gates. Depending on whether the voltage is applied at 4.1 or 4.2 the gates will cause electrical pulses to pass through 5 with a slow or rapid cadence, which are converted by 5 to corresponding sounds. (The circuit shown in FIG. 4 is of known character and an example thereof is illustrated and described in "Using Low Current SCR's" by D. R. Graham, General Eelectric Publication 200.19-1/67).

There is now examined the operation of the apparatus when the feeler 10 is placed in contact with the conductor 11, supposing that this latter successively exhibits increasing potentials.

Upon a first contact, the conductor 11 is at a potential $P \geq P0 < P1$. It results therefrom at the instant of contact a transitory oscillation which is transmitted to the trigger 15.3 of the thyristor 15 across the connection 10.15 and the input 15a and which renders the thyristor 15 conductive. Thus, a current establishes across this latter from the positive pole of the source 6, the conductor 7 and the switch 19 and traverses the resistor 15.5 for charging the capacitor 15.6 the values of which are so chosen that the said current holds the thyristor 15 at conductive condition for a short duration, for example one-half of one second. The positive voltage which appears during this period at the input of the resistor 15.5 is taken up by the conductor 8 which feeds the detector circuit 1 and the conductor 9 which feeds the detector circuit 2, but since the potential P is smaller than the threshold P1, these circuits 1 and 2 are not energized and remain at the blocked condition. When, for the reason of the charge of the capacitor 15.6 the current passing across the thyristor 15 becomes inferior to the critical holding value, said thyristor 15 returns to blocking condition and the system is again at its initial state.

Upon a second contact of the feeler 10 with the conductor 11, this latter is at a potential $P' \geq P1 < P2$. The procedure described for the first contact is reproduced as far as the thyristor 15 is concerned, but as the potential P' is at least equal to the threshold P1, the tension transmitted from the feeler 10 to the base electrode 1.1 of the transistor 1 across the connection 10.1, the input 1a and the resistance 1.2 causes the transistor 1 to change into conductive condition. A current is established by the collector 1.4 and the emitter 1.5 across the resistor 1.6. Consequently, there appears at the input of this latter a positive voltage which is applied to the input 4.1 of the circuit 4 by the output 1b and the connexion 1c, which circuit 4 then emits the first one of a series of slow signals C1 which is transmitted by the output 4b and the connexion 4c, to the warning device 5 which delivers a corresponding sonorous signal. A fraction of the voltage which becomes effective in the warning device 5 is tapped at the point 5b and, by the conductor 5c and the input 17a causes excitation of the trigger 17.4 of the thyristor 17 which passes to conductive condition. A current establishes across this latter from the positive pole of the source 6, the conductor 7, the switch 19, the thyristor 15 and the conductor 8, and traverses the resistor 17.3 at the input of which it renders apparent a positive voltage which, by the output 17b and the connection 17c is applied to the input 4.1 of the circuit 4. The value of the resistance 17.3 is determined in such a manner that the current will suffice to hold the thyristors 15 and 17 at conductive condition; accordingly, even after the end of the charging period of the retarding capacitor 15.6 this current is maintained and the voltage at the input of the resistor 17.3 remains applied at the input 1.4 of the circuit 4 which continues emission of slow cadence signals C1, which will continue after discontinuation of the contact between the feeler 10 and the conductor 11. Similarly, the voltage existing at the input to the anode 17.1 supplies the detector circuit 2, but as the potential P' is smaller than the threshold P2, the circuit 2 is not excited and remains at blocked condition.

After the return to the initial state, upon a third contact of the feeler 10 with the conductor 11, this latter has a potential P'' = P2 < P3. The described process for the second contact is reproduced, but since the potential P'' which is at least equal to the threshold P2, the voltage transmitted from the feeler 10 to the base electrode 2.1 of the transistor 2 across the connection 10.2, the input 2a and the resistor 2.2 renders said transistor 2 conductive. A current establishes through the collector 2.4 and the emitter 2.5 across the resistor 2.6. There appears accordingly at the input of this latter a positive volgage which energizes the trigger 2.7 of the thyristor 2R and makes it pass to conductive condition. Thus, a current establishes across this latter from the positive pole of the source 6, the conductor 7, the switch 19, the thyristor 15 and the conductors 8 and 9, and traverses the resistor 2.10 at the input of which there appears a positive tension which is applied across the outlet 2b and the connection 2c, to the input 4.2 of the circuit 4 which accordingly emits rapid cadence signals C2. The value of the resistor 2.10 is determined in such manner that the current suffices for holding the thyristor 2R at conductive condition. Accordingly, even after discontinuation of the contact between the feeler 10 and the conductor 11, the voltage remains at the input of the resistor 2.10 and continues production of rapid cadence signals C2 in the circuit 4. At the same time this voltage transmitted by the conductor 18 feeds the detector circuit 3, but since the potential P'' is smaller than the threshold P3, this circuit 3 is not energized and remains at blocked condition.

After return to the initial state, and upon a fourth contact of the feeler 10 with the conductor 11, this latter is at a potential P''' ≥ P3. The described process for the third contact is reproduced, but since the potential P''' is at least equal to the threshold P3, the voltage transmitted from the feeler 10 to the base 3.1 of the transistor 3 across the connection 10.3, the input 3a and the resistor 3.2 renders the transistor 3 conductive. A current establishes by the collector 3.4 and the emitter 3.5 across the resistor 3.6. Consequently, there appears at the input of this latter a positive voltage which energizes the trigger 3.7 of the thyristor 3R and causes it to pass to conductive condition. Thus, a current establishes across this latter from the positive pole of the source 6, the conductor 7, the switch 19, the thyristor 15, the conductors 8 and 9, and traverses the resistor 3.10 at the input of which there appears a positive voltage which, by the output 3B and the connection 3c, is applied to the input 4.3 of the circuit 4 which accordingly emits a continuous signal C3. The value of the resistance 3.10 is determined in such manner, that the current traversing it, suffices to hold the thyristor 3R in conductive condition. Accordingly, and in the same manner as in the case of the potentials P' and P'', the contact of the feeler 10 with the conductor 11 having a potential P''' results in a lasting acoustic signal being emitted by the warning apparatus, peculiar to each one of the thresholds of the corresponding potential. In any case, the emission of this signal is not interrupted when the switch 19 is opened, which results in returning to blocked conditions the switches of those of the relays 15, 17, 2R and 3R which had passed to conductive condition.

As it had been mentioned above it is possible, and in fact preferable, to supply the relay R3 directly by means of a conductor 19 derived from the conductor 8. This modification remains conforming with the principle of the invention, since the voltage which feeds the transistor 3 must always pass through the thyristor 2R.

The procedure which has just been described for the case of applying the potential P''' to the feeler 10, is reproduced when it is proceeded to control the operation of the apparatus by closing the switch 13 which has the effect to apply voltages to the inputs 15a, 1a, 2a and 3a, which voltages are of appropriate magnitudes to release the successive functioning of each circuit 15, 1, 2 and 3: this latter releases in turn, across the circuit 4, a continuous signal Cr which by itself furnishes the proof that the circuits 15, 1, 17, 2 and 3 are in condition of operation since the last one can only pass to conductive condition when the four preceding ones are themselves conductive.

In FIG. 3 the control circuits using a thyristor and retarding means could be replaced by suitable relays, for example electromagnetic relays.

When thyristors are used in these relays it is necessary to add a retarding or delay meanas 15b to the circuits in order to avoid an instantaneous energization of the thyristors connected downstream (for example the thyristors 17 or 2R), since the release of the thyristors is produced when a voltage is suddenly applied between the anode and the cathode thereof even in the absence of a positive tension on the trigger.

I claim:

1. A voltage detector for detecting different voltage levels in conductors of an electrical power line and generating corresponding signals, comprising:
   a. an input electrode adapted to be placed in contact with a conductor of said power line;
   b. an output electrode formed by an electrically conductive mass cooperating capacitively with the ground;
   c. at least two detector circuits having different voltage sensitivity thresholds;
   d. an electrical signal generating circuit having an input terminal for each of said detector circuits and having an output terminal, said circuit being arranged to produce recurrent electrical signals, the duration and mutual spacing of which depend on the input terminal to which a voltage is applied;
   e. a warning device for transforming said electrical signals into corresponding acoustic or optical warning signals;
   f. means for electrically connecting the input terminal of each detector circuit to said input electrode and means for electrically connecting a first output terminal of each detector circuit to an input terminal of said electrical signal generating circuit and a second output terminal to said electrically conductive mass, to bring each detector circuit into conductive condition when the voltage sensitivity threshold thereof is reached; and
   g. a current supply source for energising said detector circuits and electrical signal generating circuit, and arranged so that each detector circuit when not in conductive condition acts as an interrupter between said current supply source and the corresponding input terminal of said electrical signal generating circuit.

2. A voltage detector according to claim 1, wherein two detector circuits are provided, the first detector circuit being connected as interrupted between the current supply source and the corresponding input terminal of the electrical signal generating circuit on the one hand and the second detector circuit on the other hand, and the second detector circuit being connected as interrupter between said first detector circuit and another input terminal of the electrical signal generating circuit.

3. A voltage detector according to claim 2, including switching means associated with the first detector circuit for interrupting the passage of current from the current supply source across said first detector circuit during a predetermined time delay.

4. A voltage detector according to claim 3, including a relay connected to said switching means associated with the first detector circuit in such manner that when the warning device has emitted a first signal, the passage of current from the current supply source to the second detector circuit is maintained by the action of said relay.

5. A voltage detector according to claim 2, including a relay connected as an interrupter between the current supply source and an input terminal of the electrical signal generating circuit, the inlet of said relay being connected to the warning device in such manner that when the warning device has emitted a first signal, the electrical signal generating circuit is maintained in activated condition by said relay.

6. A voltage detector according to claim 2, including a relay connected as an interrupter between the current supply source and an input terminal of the electrical signal generating circuit, the inlet to said relay being connected to one of the detector circuits in such manner that said relay establishes and maintains the passage of current between the current supply source and said input terminal of the electrical signal generating circuit when said detector circuit passes into the conducting state.

7. A voltage detector according to claim 1, wherein three detector circuits are provided, the first detector circuit being connected as interrupted between said current supply source and the second detector circuit, the second detector circuit being connected as interrupter between the first detector circuit and the corresponding input terminal of the electrical signal generating circuit on the one hand and the third detector circuit on the other hand, and the third detector circuit being connected as interrupted between the second detector circuit and the corresponding input terminal of the electrical signal generating circuit.

8. A voltage detector according to claim 7, including a switching means associated with the first detector circuit for interrupting the passage of current from the current supply source across said first detector circuit during a predetermined time delay.

9. A voltage detector according to claim 8, including a relay connected to said switching means associated with the first detector circuit in such manner that when the warning device has emitted a first signal, the passage of current from the current supply source to the second detector circuit is maintained by the action of said relay.

10. A voltage detector according to claim 7, including a relay connected as an interrupter between the current supply source and an input terminal of the electrical signal generating circuit, the inlet of said relay being connected to the warning device in such manner that when the warning device has emitted a first signal, the electrical signal generating circuit is maintained in activated condition by said relay.

11. A voltage detector according to claim 7, including a relay connected as an interrupter between the current supply source and an input terminal of the electrical signal generating circuit, the inlet to said relay being connected to one of the detector circuits in such manner that said relay establishes and maintains the passage of current between the current supply source and said input terminal of the electrical signal generating circuit when said detector circuit passes into the conducting state.

* * * * *